(12) United States Patent  
Norrington et al.

(10) Patent No.: US 12,404,854 B2  
(45) Date of Patent: Sep. 2, 2025

(54) VALVE MODULE FOR A VACUUM PUMPING SYSTEM

(71) Applicant: Edwards Limited, Burgess Hill (GB)

(72) Inventors: Michael John Norrington, Burgess Hill (GB); Helen Shaw, Burgess Hill (GB); Stephen Phillip, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 0 days.

(21) Appl. No.: 18/557,185

(22) PCT Filed: Apr. 28, 2022

(86) PCT No.: PCT/GB2022/051078  
§ 371 (c)(1),  
(2) Date: Oct. 25, 2023

(87) PCT Pub. No.: WO2022/229642  
PCT Pub. Date: Nov. 3, 2022

(65) Prior Publication Data  
US 2024/0384715 A1   Nov. 21, 2024

(30) Foreign Application Priority Data  
Apr. 29, 2021   (GB) .................................... 2106098

(51) Int. Cl.  
*F04B 49/22*   (2006.01)  
*F04B 37/14*   (2006.01)

(52) U.S. Cl.  
CPC .............. *F04B 49/22* (2013.01); *F04B 37/14* (2013.01)

(58) Field of Classification Search  
CPC .......... F04B 37/14; F04B 41/06; F04B 49/22; C23C 14/56; C23C 16/4412  
See application file for complete search history.

(56) References Cited

U.S. PATENT DOCUMENTS

2005/0061245 A1   3/2005 Kim  
2017/0200622 A1   7/2017 Shiokawa et al.  
(Continued)

FOREIGN PATENT DOCUMENTS

CN   209974877 U   1/2020  
DE   102021202169 A1 *   9/2022  
(Continued)

OTHER PUBLICATIONS

Translation of DE 10202102169 (Year: 2022).*  
(Continued)

*Primary Examiner* — Umashankar Venkatesan  
(74) *Attorney, Agent, or Firm* — Theodore M. Magee; Westman, Champlin & Koehler, P.A.

(57) ABSTRACT

A valve module for a vacuum pumping system, comprising: a plurality of inlets for receiving a fluid; a plurality of pressure sensors, each configured to measure a fluid pressure associated with a respective inlet; a first fluid line manifold; a second fluid line manifold; a plurality of multifurcating conduits, each connecting a respective inlet to both the first and second fluid line manifolds; a plurality of valves disposed in the multifurcating conduits; and a valve controller coupled to the sensors and the valves; wherein the valve controller is configured to control, based on pressure measurements from the sensors, the valves such that a fluid flow through a multifurcating conduit is directed to either only the first fluid line manifold or only the second fluid line manifold.

15 Claims, 4 Drawing Sheets

(56) References Cited

U.S. PATENT DOCUMENTS

2019/0368041 A1    12/2019   Sreeram et al.
2020/0109470 A1    4/2020   Saito et al.

FOREIGN PATENT DOCUMENTS

| | | |
|---|---|---|
| GB | 2564399 A | 1/2019 |
| JP | H07321047 A | 12/1995 |
| JP | H10011152 | 1/1998 |
| JP | 2001289166 A | 10/2001 |
| JP | 2012054541 A | 3/2012 |
| WO | 2016052200 A1 | 4/2016 |
| WO | 2016110694 A1 | 7/2016 |
| WO | 2020109790 A1 | 6/2020 |

OTHER PUBLICATIONS

British Examination Report dated Oct. 27, 2021 and Search Report dated Oct. 25, 2021 for corresponding British Application No. GB2106098.3, 6 pages.

PCT Notification of Transmittal of the International Search Report and the Written Opinion of the International Searching Authority, or the Declaration and PCT Search Report and Written Opinion dated Jul. 25, 2022 for corresponding PCT application Serial No. PCT/GB2022/051078, 15 pages.

Japanese Notification of Reason for Rejected dated Sep. 2, 2024 for corresponding Japanese application Serial No. 2023-565239, 9 pages.

Japanese Notification of Reason for Rejection dated Jan. 9, 2025 for corresponding Japanese application Serial No. 2023-565239, 11 pages.

* cited by examiner

VALVE MODULE FOR A VACUUM PUMPING SYSTEM

CROSS-REFERENCE OF RELATED APPLICATION

This application is a Section 371 National Stage Application of International Application No. PCT/GB2022/051078, filed Apr. 28, 2022, and published as WO 2022/229642A1 on Nov. 3, 2022, the content of which is hereby incorporated by reference in its entirety and which claims priority of British Application No. 2106098.3, filed Apr. 29, 2021.

FIELD

The present invention relates to valve modules for use with vacuum pumping systems, including but not limited to vacuum systems for pumping fluids from semiconductor processing tool.

BACKGROUND

Semiconductor fabrication plants fabricate integrated circuit chips. In the fabrication of such devices, wafers are processed through a number of different processing stations, including stations at which the wafer undergoes, for example, chemical vapor deposition, physical vapor deposition, implant, etch and lithography processes. Many of these processes involve the use of a gaseous ambient and often require the use of high vacuum and reduced gas pressures.

Vacuum pumps are used to provide these reduced gas pressures in process chambers, provide chamber evacuation, and maintain flows of processing gases.

The discussion above is merely provided for general background information and is not intended to be used as an aid in determining the scope of the claimed subject matter. The claimed subject matter is not limited to implementations that solve any or all disadvantages noted in the background.

SUMMARY

When the pressure inside a chamber of a semiconductor processing tool is not at working vacuum, for example after a gas chamber has been vented to atmospheric pressure to enable service or maintenance, a so-called "pump-down event" is performed to establish the required reduced gas pressure in the chamber. A pump-down event involves pumping gas from the chamber so as to reduce the pressure therein to the required level.

Vacuum and abatement systems may be used to pump gas from multiple gas chambers of a semiconductor processing tool simultaneously using a common pump via a common manifold. The present inventors have realised that in such systems, because multiple chambers are fluidly connected to a common manifold, performing a pump-down event for one of those chambers may affect the conditions within others of those chambers. For example, a pump-down event performed on one chamber may cause highly undesirable fluctuations in other chambers connected to the same manifold.

Aspects of the present invention provide a valve module for controlling fluid from multiple chambers of a semiconductor processing tool in such a way that these deficiencies are reduced or eliminated.

In a first aspect, there is provided a valve module for a vacuum pumping system. The valve module comprises: a plurality of inlets, each inlet of the plurality of inlets being configured to receive a pumped fluid; a plurality of pressure sensors, each pressure sensor of the plurality of pressure sensors being configured to measure a pressure of a fluid associated with a respective one of the plurality of inlets; a first fluid line manifold; a second fluid line manifold; a plurality of multifurcating conduits, wherein each multifurcating conduit fluidly connects a respective inlet to both of the first fluid line manifold and the second fluid line manifold; a plurality of valves, where a respective one or more valves of the plurality of valves is disposed in a respective one of the plurality of multifurcating conduits; and a valve controller operatively coupled to the plurality of pressure sensors and the plurality of valves; wherein the controller is configured to control, based on pressure measurements received from the plurality of pressure sensors, the plurality of valves such that each of the one or more valves disposed in a respective multifurcating conduit selectably directs a fluid flow through that multifurcating conduit to either only the first fluid line manifold or only the second fluid line manifold.

Each of the multifurcating conduits may comprise a first branch and a second branch, the first branch being fluidly connected to the first fluid line manifold and the second branch being fluidly connected to the second fluid line manifold. Each of the one or more valves disposed in a respective multifurcating conduit may comprise a first valve disposed in the first branch of that multifurcating conduit, and a second valve disposed in the second branch of that multifurcating conduit.

The plurality of pressure sensors may comprise a first pressure sensor configured to measure the pressure of a fluid associated with a first inlet of the plurality of inlets, the first inlet being an inlet of a first multifurcating conduit of the plurality of multifurcating conduits. The valve controller may be configured to, responsive to pressure measurements received from the first pressure sensor fulfilling one or more first criteria, control the one or more valves disposed in the first multifurcating conduit to direct fluid flow through the first multifurcating conduit to the second fluid line manifold. The one or more first criteria may consist of one or more criteria selected from the group of criteria consisting of: the measured pressure exceeding a first threshold value; the measured pressure exceeding the first threshold value for at least a first time period; a rate of increase of the measured pressure exceeding a second threshold value; and a rate of increase of the measured pressure exceeding the second threshold value for at least a second time period. The valve controller may be configured to, responsive to pressure measurements received from the first pressure sensor fulfilling one or more second criteria, controlling the one or more valves disposed in the first multifurcating conduit to direct fluid flow through the first multifurcating conduit to the first fluid line manifold. The one or more second criteria may consist of one or more criteria selected from the group of criteria consisting of: the measured pressure being less than or equal to a third threshold value; the measured pressure being less than the third threshold value for at least a third time period; a rate of decrease of the measured pressure exceeding a fourth threshold value; a rate of decrease of the measured pressure exceeding the fourth threshold value for at least a fourth time period; a predefined time period elapsing.

At least the plurality of inlets, the first fluid line manifold, the second fluid line manifold, the plurality of multifurcating conduits, the plurality of valves, and the valve controller may be configured as a single integrated unit and housed in a frame.

The valve module may further comprise a plurality of further valves, wherein, for each valve of the plurality of valves, a respective pair of further valves is disposed either side of that valve. The further valves may be manually operated valves.

The valve module may further comprise a gas inlet for receiving a gas for purging one or more of the multifurcating conduits and/or actuating one or more of the valves.

In a further aspect, there is provided a system comprising: a semiconductor processing tool comprising a plurality of processing chambers; the valve module of any preceding aspect, wherein each inlet of the plurality of inlets is fluidly coupled to a respective processing chamber of the plurality of processing chambers; and one or more vacuum pumps operating coupled to the first fluid line manifold and the second fluid line manifold.

The system may further comprise cooling apparatus for providing a cooling fluid to one or more of the processing chambers, wherein the valve module is disposed on top of the cooling apparatus.

In a further aspect, there is provided a method for valve module for a vacuum pumping system, the valve module comprising: receiving, at each inlet of a plurality of inlets, a respective pumped fluid, each inlet being an inlet to a respective multifurcating conduit of a plurality of multifurcating conduits, each multifurcating conduit fluidly connecting a respective inlet to both of a first fluid line manifold and a second fluid line manifold; measuring, by one or more pressure sensors of a plurality of pressure sensors, a pressure of a respective one of the pumped fluids; and controlling, by a controller, based the one or more measured pressures, one or more valves of a plurality of valves, the one or more valves being disposed in a first multifurcating conduit of the plurality of multifurcating conduits; wherein the controlling the one or more valves selectably directs a fluid flow through the first multifurcating conduit to either only the first fluid line manifold or only the second fluid line manifold.

The method may further comprise measuring, by a first pressure sensor of a plurality of pressure sensors, a pressure of a pumped fluid in the first multifurcating conduit, and, responsive to pressure measurements received from the first pressure sensor fulfilling one or more first criteria, controlling the one or more valves disposed in the first multifurcating conduit to direct fluid flow through the first multifurcating conduit to the second fluid line manifold and preventing fluid flow through the first multifurcating conduit to the first fluid line manifold. The method may further comprise, thereafter, responsive to pressure measurements received from the first pressure sensor fulfilling one or more second criteria, controlling the one or more valves disposed in the first multifurcating conduit to prevent fluid flow through the first multifurcating conduit to the second fluid line manifold, and subsequently direct fluid flow through the first multifurcating conduit to the first fluid line manifold.

The Summary is provided to introduce a selection of concepts in a simplified form that are further described in the Detailed Description. This summary is not intended to identify key features or essential features of the claimed subject matter, nor is it intended to be used as an aid in determining the scope of the claimed subject matter.

DETAILED DESCRIPTION

Figure 1:
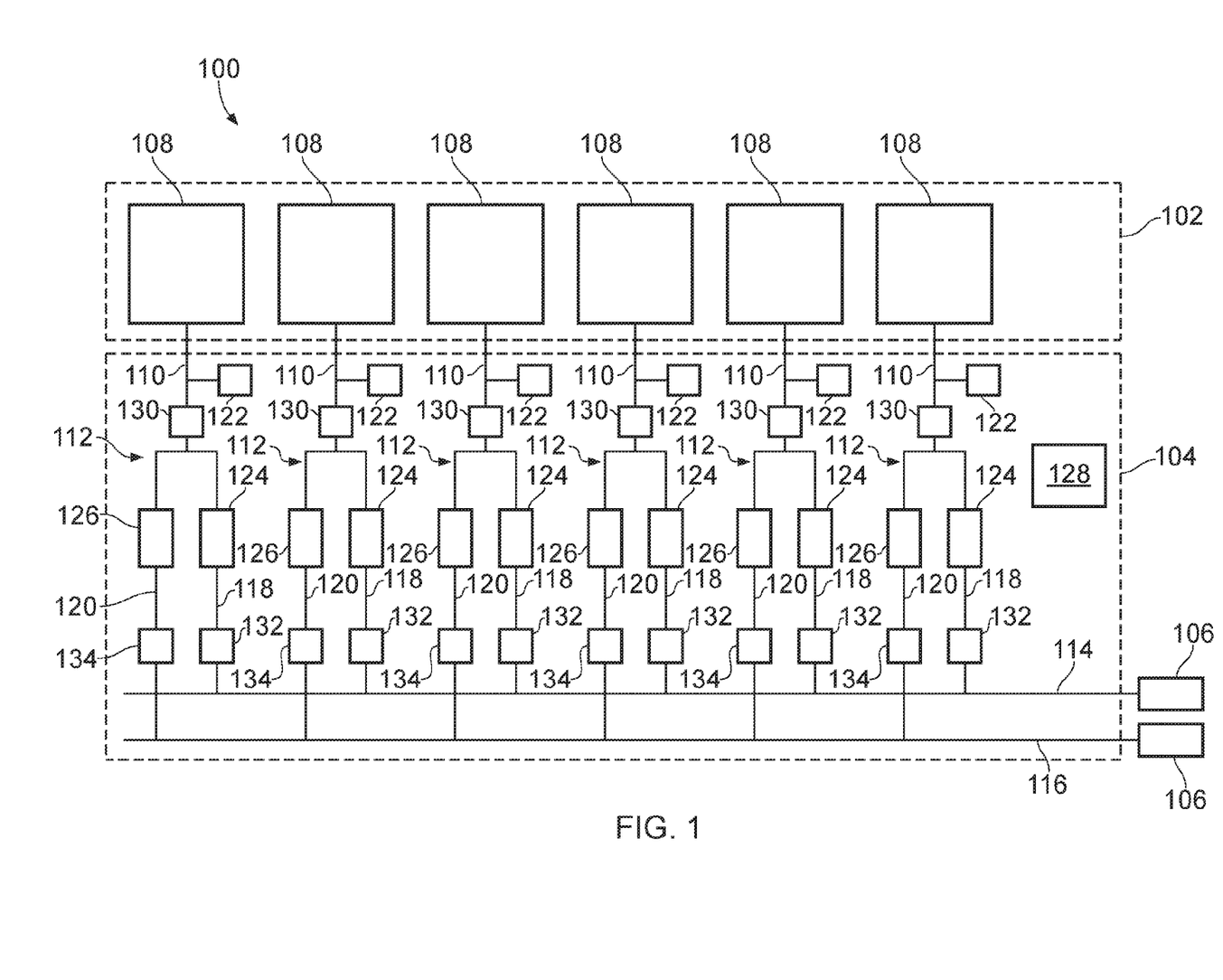
FIG. 1 is a schematic illustration (not to scale) of a semiconductor fabrication facility.

FIG. 1 is a schematic illustration (not to scale) of a semiconductor fabrication facility 100, in accordance with an embodiment.

The semiconductor fabrication facility 100 comprises a semiconductor processing tool 102, a valve module 104, and a plurality of vacuum pumps 106.

The semiconductor processing tool 102 comprises a plurality of process chambers 108 in which semiconductor wafers undergo respective processes. Examples of such processes include, but are not limited to, chemical vapor deposition, physical vapor deposition, implant, etch and lithography processes.

The plurality of vacuum pumps 106 are configured to pump fluids (i.e. process gases) out of the process chambers 108 of the semiconductor processing tool 102 via the valve module 104.

The valve module 104 comprises a plurality of inlets 110, a plurality of multifurcating conduits 112, a first fluid line manifold 114, and a second fluid line manifold 116.

Each of the inlets 110 is fluidly connected to a respective process chamber 108, such that a pumped fluid may be received from that process chamber 108.

Each multifurcating conduit 112 fluidly connects a respective inlet 110 to both of the first fluid line manifold 114 and the second fluid line manifold 116. More specially, in this embodiment, the multifurcating conduits 112 are bifurcating conduits comprising respective first and second branches 118, 120. The first branch 118 of each multifurcating conduit 112 fluidly connects the respective inlet 110 to the first fluid line manifold 114. The second branch 120 of each multifurcating conduit 112 fluidly connects the respective inlet 110 to the second fluid line manifold 116.

The valve module 104 further comprises a plurality of pressure sensors 122. Each pressure sensor 122 is operatively coupled to a respective inlet 110, or to a respective multifurcating conduit 112 at or proximate to an inlet 110.

Each pressure sensor 122 is configured to measure a pressure associated with a respective process chamber 108. In particular, each pressure sensor 122 is configured to measure a pressure of a process gas that is being pumped out of a respective process chamber 108. It is preferable that the pressure sensors 122 are located as close as possible to the outlets of the process chambers 108.

The valve module 104 further comprises a plurality of gate valves, and more specifically a plurality of first gate valves 124 and a plurality of second gate valves 126. In this embodiment, the first gate valves 124 and the second gate valves 126 are pneumatic valves.

Each of the first gate valves 124 is disposed on a respective one of the first branches 118, and is configured to control the flow of fluid therethrough.

Each of the second gate valves 126 is disposed on a respective one of the second branches 120, and is configured to control the flow of fluid therethrough.

The valve module 104 further comprises a valve controller 128.

The valve controller 128 is operatively coupled, via wired or wireless connections (not shown), to each of the plurality of pressure sensors 122 such that pressure measurements taken by the plurality of pressure sensors 122 may be received by the valve controller 128.

The valve controller 128 is further operatively coupled, via respective pneumatic lines (not shown), to each of the first gate valves 124 and each of the of second gate valves 126.

As described in more detail later below with reference to FIG. 3, the valve controller 128 is configured to control operation of the first and second gate valves 124, 126, based on the pressure measurements received from the pressure sensors 122. The valve controller 128 is configured to control operation of the first and second gate valves 124, 126 by transferring pneumatic fluid thereto via the pneumatic lines.

The valve module 104 further comprises a plurality of manual valves (i.e. valve that are configured to be operated manually by a human operator), and more specifically a plurality of first manual valves 130, a plurality of second manual valves 132, and a plurality of third manual valves 134.

In this embodiment, each first manual valve 130 is disposed on a respective multifurcating conduit 112 between the pressure sensor 122 of that multifurcating conduit 112 and the point at which that multifurcating conduit 112 bifurcates.

In this embodiment, each second manual valve 132 is disposed on a respective first branch 118 of a multifurcating conduit 112 between the first gate valve 124 of that multifurcating conduit 112 and the first fluid line manifold 114.

In this embodiment, each third manual valve 134 is disposed on a respective second branch 120 of a multifurcating conduit 112 between the second gate valve 126 of that multifurcating conduit 112 and the second fluid line manifold 116.

Thus, in this embodiment, each of the first and second gate valves 124, 126 is disposed between a respective pair of manual valves 130-134. In particular, each first gate valve 124 is disposed between a first manual valve 130 and a second manual valve 132. Also, each second gate valve 126 is disposed between a first manual valve 130 and a third manual valve 134.

In this embodiment, the first fluid line manifold 114 is a manifold via which process gases are pumped from process chambers 108 in which semiconductor fabrication processes are being conducted. The first fluid line manifold 114 may be considered to be a "process gas line". The second fluid line manifold 116 may be considered to be a "pump-down gas line". The fluid line manifolds 114 and 116 are suitably sized for the gas flow and vacuum requirements.

A pump-down event may be performed to evacuate gas from one or more of the process chambers 108, which may be at atmospheric pressure, to reduce the pressure therein to a level suitable for a semiconductor fabrication process. The gases evacuated from a gas chamber during pump-down are, for convenience, hereinafter referred to as pump-down gases. In this embodiment, the second fluid line manifold 116 is a manifold via which pump-down gases are pumped out of the process chambers 108.

Apparatus, including the valve controller 128, for implementing the above arrangement, and performing the method steps to be described below, may be provided by configuring or adapting any suitable apparatus, for example one or more computers or other processing apparatus or processors, and/or providing additional modules. The apparatus may comprise a computer, a network of computers, or one or more processors, for implementing instructions and using data, including instructions and data in the form of a computer program or plurality of computer programs stored in or on a machine readable storage medium such as computer memory, a computer disk, ROM, PROM etc., or any combination of these or other storage media.

Figure 2:
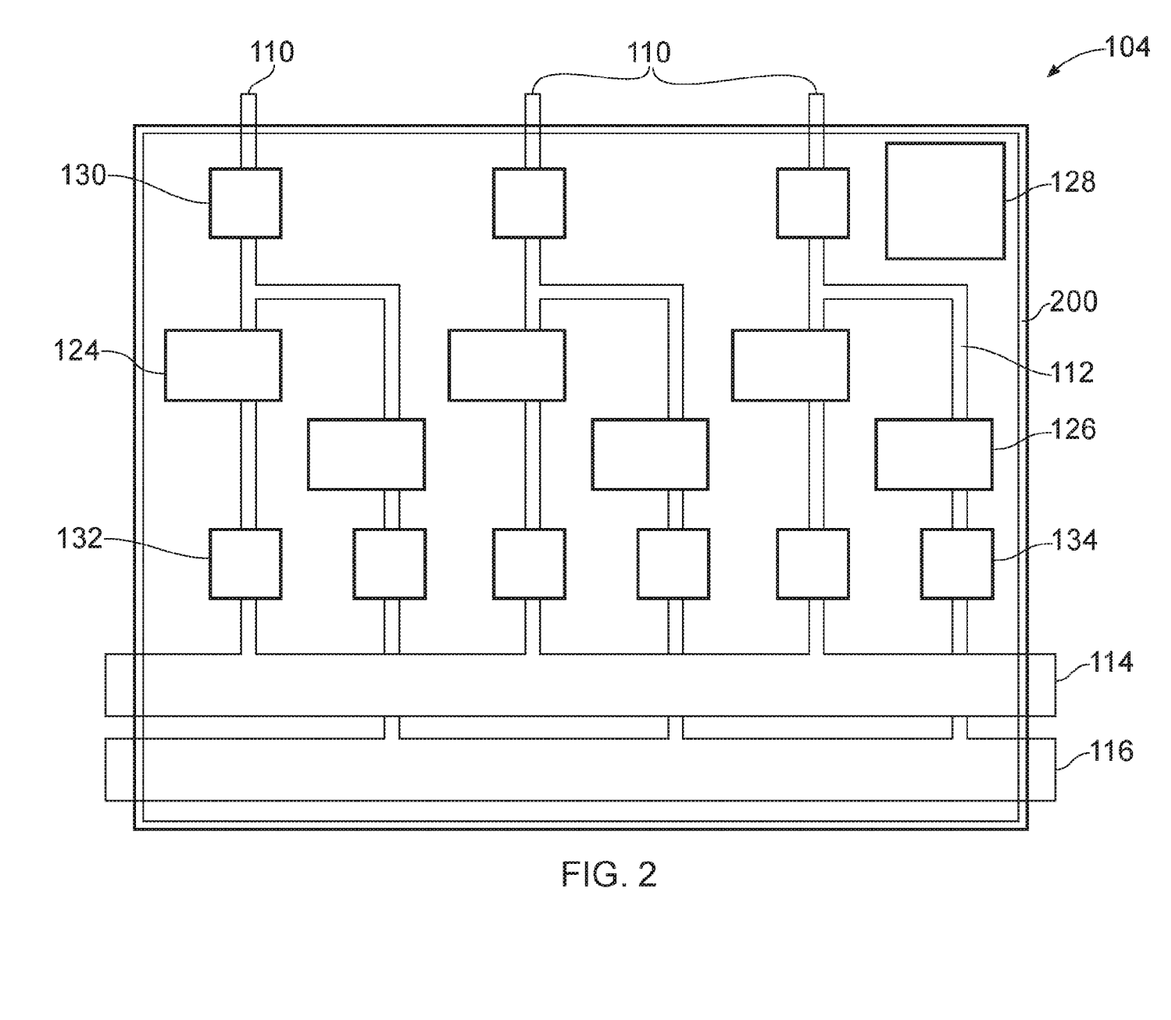
FIG. 2 is a schematic illustration (not to scale) showing a perspective view of a valve module of the semiconductor fabrication facility.

FIG. 2 is a schematic illustration, not to scale, showing a perspective view of the valve module 104.

In this embodiment, certain components of the valve module 104, including, for example, at least the inlets 110, the multifurcating conduits 112, the first fluid line manifold 114, the second fluid line manifold 116, the gate valves 124, 126, the valve controller 128, and the manual valves 130, 132, 134 are configured or arranged as a single, integrated unit, hereinafter referred to a the "first integrated unit". These components are housed in a common frame 200. The frame 200 may be made of steel.

In some embodiments, the pressure sensors 122 are also comprised in the first integrated unit, and may be housed in the frame 200. However, in some embodiments, the pressure sensors 122 are separate to the first integrated unit. For example, the pressure sensors 122 may be configured or arranged as a separate, second integrated unit that may be coupled to the first integrated unit, e.g. to the top of the first integrated unit. The second integrated unit comprising the pressure sensors 122 may be coupled between the process chambers 108 and the inlets 110 of the first integrated unit.

Figure 3:
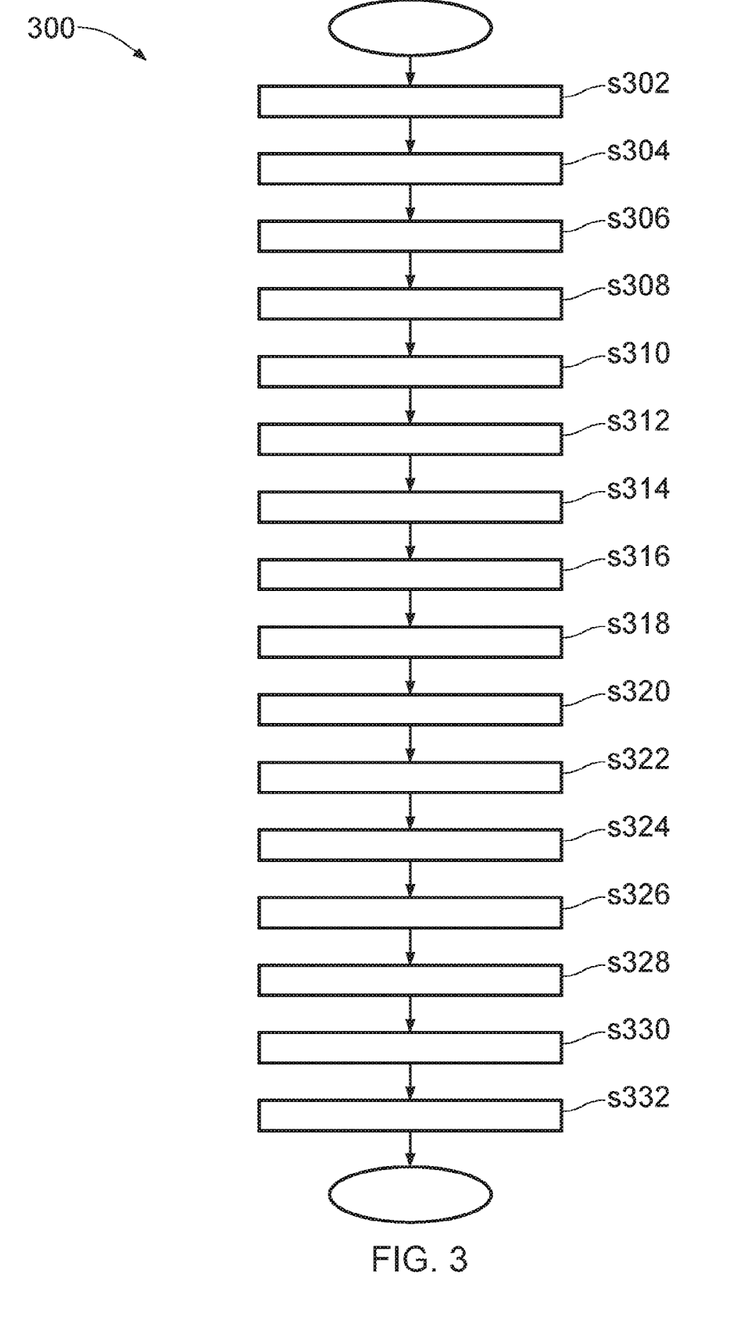
FIG. 3 is a process flow chart showing certain steps of a process of pumping gas in the semiconductor fabrication facility.

FIG. 3 is a process flow chart showing certain steps of a process 300 of pumping gas in the semiconductor fabrication facility 100.

It should be noted that certain of the process steps depicted in the flowchart of FIG. 3 and described below may be omitted or such process steps may be performed in differing order to that presented below and shown in FIG. 3. Furthermore, although all the process steps have, for convenience and ease of understanding, been depicted as discrete temporally-sequential steps, nevertheless some of the process steps may in fact be performed simultaneously or at least overlapping to some extent temporally.

At step s302, semiconductor fabrication processes are performed in the process chambers 108. These semiconductor fabrication processes generate process gases.

In this embodiment, at this stage, the first gate valves 124 are open and the second gate valves 126 are closed. Also, all of the manual valves 130-134 are open.

At step s304, the vacuum pump 106 coupled to the first fluid line manifold 114 pumps the generated process gases out of the process chambers 108 via the valve module 104. In particular, in this embodiment, processes gases are pumped from each process chamber 108 and through, in turn, the inlet 110 coupled thereto, the first branch 118 of the multifurcating conduits 112 coupled thereto (including through the first gate valve 124 disposed thereon), and the first fluid line manifold 114.

At step s306, the pressure sensors 122 measure pressures associated with the process chambers 108. In particular, each pressure sensor 122 measures a pressure of a process gas that is being pumped through a respective inlet 110. In this embodiment, the pressure sensors 122 measure the pressures substantially continuously.

At step s308, the pressure sensors 122 send the measured pressure values to the valve controller 128. The valve controller 128 processes the received measured pressure values substantially continuously.

At step s310, one of the process chambers 108 (hereinafter referred to as "the first process chamber 108" for convenience) is shut down for inspection, servicing, repair, or maintenance. In this embodiment, the shutting down the first process chamber 108 comprises stopping pumping gas from the first process chamber 108. In this embodiment, this may be achieved by the operator closing an isolating valve in inlet 110 associated with the first process chamber 108. In this embodiment, the shutting down the first process chamber 108 further comprises increasing the pressure in the first process chamber 108 to approximately atmospheric pressure. This may be achieved by opening a valve coupled to the first process chamber 108, thereby allowing air to enter into the first process chamber 108.

At step s312, a human operator performs an inspection, servicing, repair, or maintenance operation on the first process chamber 108.

Following the inspection, servicing, repair, or maintenance operation, a low gas pressure environment is to be re-established in the first process chamber 108 such that semiconductor fabrication processes may be performed therein.

Accordingly, at step s314, the isolating valve associated with the first process chamber 108 is reopened, thereby allowing gases to be pumped from the first process chamber 108.

This pumping of gases from the first process chamber 108 at step s314 is a pump-down event.

At step s316, the valve controller 128, processing the measured pressure values received from the pressure sensors 122, determines that a pump-down event is occurring.

In particular, in this embodiment, the valve controller 128 determines that a pump-down event is occurring for the first process chamber 108 in response to the measured pressure associated with the first process chamber 108 exceeding a first threshold value and/or a calculated rate of increase of the measured pressure associated with first process chamber 108 exceeding a second threshold value.

The first threshold value may be any appropriate threshold valve. The second threshold value may be any appropriate threshold valve.

In some embodiments, the valve controller 128 determines that the pump-down event is occurring for the first process chamber 108 in response to the measured pressure associated with first process chamber 108 exceeding the first threshold value for at least a first time period. The first time period may be any appropriate time period.

In some embodiments, the valve controller 128 determines that the pump-down event is occurring for the first process chamber 108 in response to the calculated rate of increase of the measured pressure associated with first process chamber 108 exceeding the second threshold value for at least a second time period. The second time period may be any appropriate time period.

At step s318, responsive to detecting the pump-down event for the first process chamber 108, the valve controller 128 controls the first gate valve 124 associated with the first process chamber 108 to close. Thus, gas flow from the first process chamber 108 to the first fluid line manifold 114 is prevented or opposed.

In this embodiment, the valve controller 128 conveys pneumatic fluid (e.g. nitrogen) to the first gate valve 124 thereby to control the first gate valve 124.

At step s320, following closure of the first gate valve 124, the valve controller 128 controls the second gate valve 126 associated with the first process chamber 108 to open. Thus, gas flow from the first process chamber 108 to the second fluid line manifold 116 is permitted.

In this embodiment, the valve controller 128 conveys pneumatic fluid to the second gate valve 126 thereby to control the second gate valve 126.

At step s322, the vacuum pump 106 coupled to the second fluid line manifold 116 pumps the pump-down gas out of the first process chamber 108 via the valve module 104. In particular, in this embodiment, pump-down gas is pumped from the first process chamber 108 and through, in turn, the inlet 110 coupled thereto, the second branch 120 of the multifurcating conduits 112 coupled thereto (including through the open second gate valve 126 disposed thereon), and the second fluid line manifold 116.

Thus, pump-down gas is pumped out of the first process chamber 108 thereby to establish a low gas pressure or vacuum environment therein.

At step s324, the valve controller 128, processing the measured pressure values received from the pressure sensors 122, determines that the pump-down event has ended.

In particular, in this embodiment, the valve controller 128 determines that a pump-down event for the first process chamber 108 has ended in response to the measured pressure associated with the first process chamber 108 being less than or equal to a third threshold value and/or a calculated rate of decrease of the measured pressure associated with first process chamber 108 being more than or equal to a second fourth value. Alternatively, a pump-down event is ended after it has been running for a predefined time period.

The third threshold value may be any appropriate threshold value. In some embodiments, the third threshold value is equal to, or less than, the first threshold value.

The fourth threshold value may be any appropriate threshold valve. In some embodiments, the fourth threshold value is equal to, or less than, the second threshold value.

In some embodiments, the valve controller 128 determines that the pump-down event for the first process chamber 108 has ended in response to the measured pressure associated with first process chamber 108 being less than or equal to the third threshold value for at least a third time period. The third time period may be any appropriate time period.

In some embodiments, the valve controller 128 determines that the pump-down event for the first process chamber 108 has ended in response to the calculated rate of decrease of the measured pressure associated with first process chamber 108 being more than or equal to the fourth threshold value for at least a fourth time period. The fourth time period may be any appropriate time period.

At step s326, responsive to detecting the pump-down event for the first process chamber 108 has ended, the valve controller 128 controls the second gate valve 126 associated with the first process chamber 108 to close. Thus, gas flow from the first process chamber 108 to the second fluid line manifold 116 is prevented or opposed.

At step s328, following closure of the second gate valve 126, the valve controller 128 controls the first gate valve 124 associated with the first process chamber 108 to open. Thus, gas flow from the first process chamber 108 to the first fluid line manifold 114 is permitted.

At step s330, semiconductor fabrication processes may be performed in the first process chambers 108. These semiconductor fabrication processes generate process gases.

At step s332, the vacuum pump 106 coupled to the first fluid line manifold 114 pumps the generated process gases out of the first process chamber 108 via the valve module 104.

Thus, a process 300 of pumping gas in the semiconductor fabrication facility 100 is provided.

The above-described system and method advantageously tends to reduce or eliminate pump-down events detrimentally affecting the conditions within parallel gas chambers. This tends to be achieved by pumping pump-down gases to a separate manifold that is different to that which process gases are pumped to.

Advantageously, pump-down events, and the ending of pump-down events, tend to be detected and mitigated against automatically.

Advantageously, the above-described valve module may be integrated in-line with horizontal manifolds connecting the semiconductor processing tool to the vacuum pumps.

Advantageously, the above-described valve module tends to be robust. The vacuum module may be fully assembled, leak checked, and pre-tested, for example, off-site prior to delivery to a semiconductor fabrication facility, or on-site when delivered. This tends to simplify the installation process and reduce installation time.

Advantageously, the above-described valve module tends to be modular and scalable.

Advantageously, the components in the gas streams of the valve module tend to be easy to service, repair or replace. For example, each gate valve can be isolated from fluid flow by closing the manual valve upstream and downstream of that gate valve, allowing a human operator to service, repair or replace the gate valve.

Advantageously, the status and operating condition of the system tends to be easily monitorable, for example, either via a Human Machine Interface of the valve module, or remotely.

Advantageously, each valve module in a system tends to be easily controllable by a system controller, for example using a communication protocol such as EtherCAT or ethernet.

Advantageously, the above-described valve module allows for multiple mounting options. For example, the valve module may be suspended from a ceiling of a semiconductor fabrication facility, which provides a benefit of not consuming floor space. Alternatively, the valve module can be mounted in a floor-standing frame or on top of other equipment.

What will now be described is an embodiment in which the valve module is mounted on top of other equipment, specifically cooling apparatus for controlling the temperature of the process chambers of the semiconductor processing tool.

Figure 4:
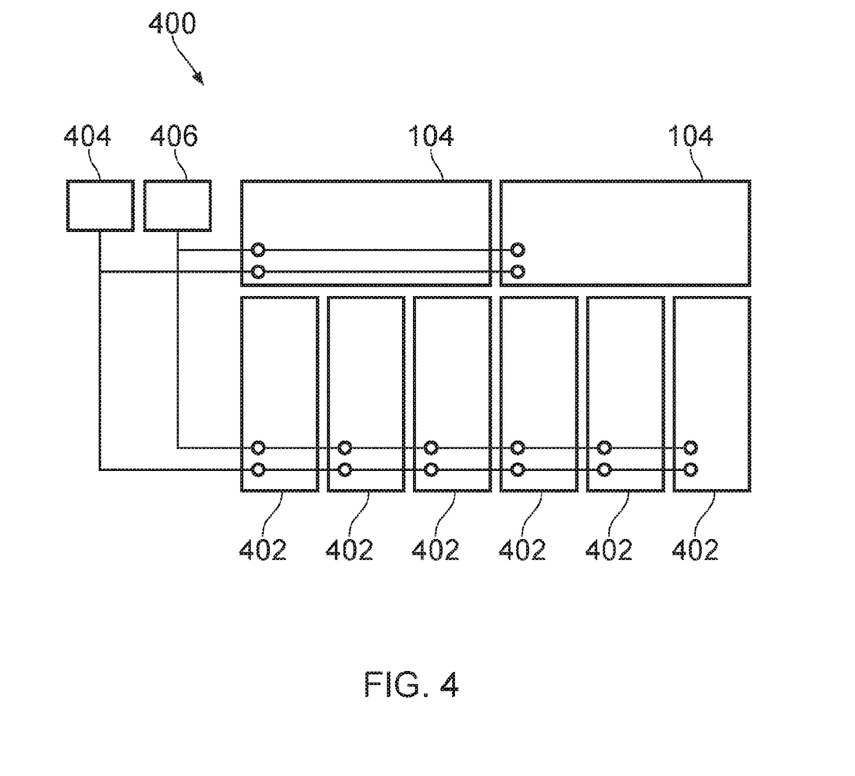
FIG. 4 is a schematic illustration (not to scale) showing a system in which two valve modules are mounted on top of a plurality of cooling apparatuses.

FIG. 4 is a schematic illustration (not to scale) showing a system 400 in which two valve modules 104 are mounted on top of a plurality of cooling apparatuses 402. The cooling apparatuses 402 are typically referred to as "chiller racks" or "chillers".

The system 400 comprises six cooling apparatuses 402, two valve modules 104, a power source 404, and a pneumatic source 406.

In this embodiment, the valve modules 104 may be substantially identical to those described above with reference to FIGS. 1 and 2. Each valve module 104 is configured to receive a respective plurality of pumped fluid flows from process chambers 108 fluidly coupled thereto.

Each cooling apparatus 402 is fluidly coupled to a respective process chamber 108. Each cooling apparatus 402 is configured to supply a flow of a cooling fluid to the respective process chamber 108 to which it is coupled. The cooling fluid may be used in the process chambers 108 for controlling temperature.

In this embodiment, the valve modules 104 and the cooling apparatuses 402 are arranged in a stacked configuration. More specifically, each valve module is disposed on top of three of the cooling apparatuses 402, which themselves are positioned adjacent to one another, e.g. in a side-by-side configuration.

Advantageously, the stacked arrangement provides a reduced footprint within a semiconductor fabrication facility.

Furthermore, the stacked arrangement tends to facilitate coupling of the cooling apparatuses 402 and the valve modules 104 to the process chambers 108. For example, the stacked arrangement tends to allow for closer positioning of the cooling apparatuses 402 and/or the valve modules 104 with respect to the process chambers 108, thereby reducing conduit lengths and, consequently, installation time and difficulty. In addition, the likelihood of leakage from or damage to conduits may be reduced due to their reduced lengths.

In this embodiment, the power source 404 is electrically coupled to each of the cooling apparatuses 402 and the valve modules 104. The power source 404 is configured to supply electrical power to each of the cooling apparatuses 402 and the valve modules 104. Accordingly, the power source 404 may be considered to be a common power source.

Advantageously, use of a common power source for the cooling apparatuses 402 and the valve modules 104 facilitates installation and tends to provide for reduced footprint and cabling.

In this embodiment, the pneumatic source 406 is fluidly coupled, via one or more conduits, to each of the cooling apparatuses 402 and the valve modules 104. The pneumatic source 406 is configured to supply a pneumatic fluid to each of the cooling apparatuses 402 and the valve modules 104. Accordingly, the pneumatic source 406 may be considered to be a common pneumatic source. The pneumatic fluid may be any appropriate type of gas including, but not limited to, nitrogen gas, or CDA (Clean Dry Air).

Advantageously, use of a common pneumatic source 406 for the cooling apparatuses 402 and the valve modules 104 facilitates installation and tends to provide for reduced footprint and pneumatic fluid conduit length.

In this embodiment, in the valve modules 104, the pneumatic fluid received from the pneumatic source 406 may be used to actuate valves of the valve modules 104. More specifically, the valve controller 128 of a valve module 104 may be configured to convey the pneumatic fluid, via respective pneumatic lines, to each of the first gate valves 124 and each of the of second gate valves 126, thereby to actuate the first and second gate valves 124, 126. Thus, the pneumatic fluid may be considered to be a "valve control fluid".

In this embodiment, in the valve modules 104, the pneumatic fluid received from the pneumatic source 406 may be used to perform a purge process, to purge a portion of one or more of the multifurcating conduits 112. More specifically, a manual operator is able to convey the pneumatic fluid into each of the multifurcating conduits 112 via a respective purge port in each of the multifurcating conduits 112. The pneumatic fluid may be forced through at least a portion of a multifurcating conduit 112 thereby to purge the at least a portion of a multifurcating conduit 112. The pneumatic fluid may exit a multifurcating conduit 112 via the first fluid line manifold 114 and/or the second fluid line manifold 116. Thus, the pneumatic fluid may be considered to be a "purge fluid". Purging may typically be performed prior to maintaining or servicing the valve module 104, e.g.

replacing first gate valve 124 and/or second gate valve 126. Advantageously, a first gate valve 124 and/or a second gate valve 126 may be isolated from the rest of the system by closing the first manual valve 130, the second manual valve 132, and the third manual valve 134.

In this embodiment, the purge ports in the valve modules 104 may be used to perform a leak test on one or more of the multifurcating conduits 112. More specifically, a valve module 104 may further comprise means for detecting a leak from the multifurcating conduits 112 using the purge ports, or a human operator may detect the presence of a leak using appropriate sensing equipment attached to the purge ports.

In the embodiment shown in FIG. 4, there are six cooling apparatuses 402 and two valve modules 104. However, in other embodiments, the system may comprise a different number of cooling apparatuses and/or a different number of valve modules.

In the embodiment shown in FIG. 4, each of the valve modules 104 is mounted on top of three cooling apparatuses 402. However, in other embodiments, one or more of the valve modules may be mounted on top of a different number of cooling apparatuses. In some embodiments, one or more cooling apparatuses are mounted on top of one or more valve modules or other equipment.

In the above embodiments, the valve module is implemented in a semiconductor fabrication facility for routing pumped process gases. However, in other embodiments, the valve module may be implemented in a different system and be used for routing a different type of fluid.

In the above embodiments, there is a single semiconductor processing tool which comprises six gas chambers. However, in other embodiments, there is more than one semiconductor processing tool. One or more of the semiconductor processing tool may comprise a different number of gas chambers, other than six.

In the above embodiments, there is either a single valve module, or in the embodiment of FIG. 4, two valve modules. However, in other embodiments, there may be a different number of valve modules.

In the above embodiments, a valve module comprises six inlets and six multifurcating conduits. However, in other embodiments, the valve module comprises a different number of inlets and multifurcating conduits other than six.

In the above embodiments, each multifurcating conduit comprises two gate valves, one on each branch. However, in other embodiments, a multifurcating conduit comprises a different number of gate valves other than two. In some embodiments, a multifurcating conduit comprises a single valve (e.g. a three-way valve) operable to direct fluid flow along a select branch on the multifurcating conduit. In some embodiments, multiple gate valves are arranged along each branch. In some embodiments, a multifurcating conduit comprises more than two branches, each of which may include a respective one or more gate valves.

In the above embodiments, each multifurcating conduit comprises three manual valves. However, in other embodiments, a multifurcating conduit comprises a different number of manual valves other than three. For example, in some embodiments, the manual valve may be omitted. In some embodiments, a multifurcating conduit comprises more than three manual valves arranged along the multifurcating conduit in any appropriate way.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A valve module for a vacuum pumping system, the valve module comprising:
   a plurality of inlets, each inlet of the plurality of inlets being configured to receive a pumped fluid;
   a plurality of pressure sensors, each pressure sensor of the plurality of pressure sensors being configured to measure a pressure of a fluid associated with a respective one of the plurality of inlets;
   a first fluid line manifold;
   a second fluid line manifold;
   a plurality of multifurcating conduits, wherein each multifurcating conduit fluidly connects a respective inlet to both of the first fluid line manifold and the second fluid line manifold;
   a plurality of valves, where a respective one or more valves of the plurality of valves is disposed in a respective one of the plurality of multifurcating conduits; and
   a valve controller operatively coupled to the plurality of pressure sensors and the plurality of valves; wherein
   the valve controller is configured to control, based on pressure measurements received from the plurality of pressure sensors, the plurality of valves such that each of the one or more valves disposed in a respective multifurcating conduit selectably directs a fluid flow through that multifurcating conduit to either only the first fluid line manifold or only the second fluid line manifold.

2. The valve module of claim 1, wherein:
   each of the multifurcating conduits comprises a first branch and a second branch, the first branch being fluidly connected to the first fluid line manifold and the second branch being fluidly connected to the second fluid line manifold; and
   each of the one or more valves disposed in a respective multifurcating conduit comprises a first valve disposed in the first branch of that multifurcating conduit, and a second valve disposed in the second branch of that multifurcating conduit.

3. The valve module of claim 1, wherein:
   the plurality of pressure sensors comprises a first pressure sensor configured to measure the pressure of a fluid associated with a first inlet of the plurality of inlets, the first inlet being an inlet of a first multifurcating conduit of the plurality of multifurcating conduits; and
   the valve controller is configured to, responsive to pressure measurements received from the first pressure sensor fulfilling one or more first criteria, control the one or more valves disposed in the first multifurcating conduit to direct fluid flow through the first multifurcating conduit to the second fluid line manifold.

4. The valve module of claim 3, wherein the one or more first criteria consist of one or more criteria selected from the group of criteria consisting of: the measured pressure exceeding a first threshold value; the measured pressure exceeding the first threshold value for at least a first time period; a rate of increase of the measured pressure exceeding a second threshold value; and a rate of increase of the measured pressure exceeding the second threshold value for at least a second time period.

5. The valve module of claim 3, wherein the valve controller is configured to, responsive to pressure measurements received from the first pressure sensor fulfilling one or more second criteria, controlling the one or more valves disposed in the first multifurcating conduit to direct fluid flow through the first multifurcating conduit to the first fluid line manifold.

6. The valve module of claim 5, wherein the one or more second criteria consist of one or more criteria selected from the group of criteria consisting of: the measured pressure being less than or equal to a third threshold value; the measured pressure being less than the third threshold value for at least a third time period; a rate of decrease of the measured pressure exceeding a fourth threshold value; a rate of decrease of the measured pressure exceeding the fourth threshold value for at least a fourth time period; a predefined time period elapsing.

7. The valve module of claim 1, wherein at least the plurality of inlets, the first fluid line manifold, the second fluid line manifold, the plurality of multifurcating conduits, the plurality of valves, and the valve controller are configured as a single integrated unit and housed in a frame.

8. The valve module of claim 1, further comprising a plurality of further valves, wherein, for each valve of the plurality of valves, a respective pair of further valves is disposed either side of that valve.

9. The valve module of claim 8, wherein the further valves are manually operated valves.

10. The valve module of claim 1, further comprising a gas inlet for receiving a gas for purging one or more of the multifurcating conduits and/or actuating one or more of the valves.

11. A system comprising:
a semiconductor processing tool comprising a plurality of processing chambers;
the valve module of claim 1, wherein each inlet of the plurality of inlets is fluidly coupled to a respective processing chamber of the plurality of processing chambers; and
one or more vacuum pumps operating coupled to the first fluid line manifold and the second fluid line manifold.

12. The system of claim 11, further comprising cooling apparatus for providing a cooling fluid to one or more of the processing chambers, wherein the valve module is disposed on top of the cooling apparatus.

13. A method for valve module for a vacuum pumping system, the valve module comprising:
receiving, at each inlet of a plurality of inlets, a respective pumped fluid, each inlet being an inlet to a respective multifurcating conduit of a plurality of multifurcating conduits, each multifurcating conduit fluidly connecting a respective inlet to both of a first fluid line manifold and a second fluid line manifold;
measuring, by one or more pressure sensors of a plurality of pressure sensors, a pressure of a respective one of the pumped fluids; and
controlling, by a controller, based the one or more measured pressures, one or more valves of a plurality of valves, the one or more valves being disposed in a first multifurcating conduit of the plurality of multifurcating conduits;
wherein the controlling the one or more valves selectably directs a fluid flow through the first multifurcating conduit to either only the first fluid line manifold or only the second fluid line manifold.

14. The method of claim 13, further comprising:
measuring, by a first pressure sensor of a plurality of pressure sensors, a pressure of a pumped fluid in the first multifurcating conduit; and
responsive to pressure measurements received from the first pressure sensor fulfilling one or more first criteria, controlling the one or more valves disposed in the first multifurcating conduit to direct fluid flow through the first multifurcating conduit to the second fluid line manifold and preventing fluid flow through the first multifurcating conduit to the first fluid line manifold.

15. The method of claim 14, further comprising thereafter, responsive to pressure measurements received from the first pressure sensor fulfilling one or more second criteria, controlling the one or more valves disposed in the first multifurcating conduit to prevent fluid flow through the first multifurcating conduit to the second fluid line manifold, and subsequently direct fluid flow through the first multifurcating conduit to the first fluid line manifold.

* * * * *